United States Patent
Yoo (10) Patent No.: US 6,916,711 B2
(45) Date of Patent: Jul. 12, 2005

(54) EEPROM MEMORY CELL AND METHOD OF FORMING THE SAME

(75) Inventor: Hyun-Khe Yoo, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/819,515

(22) Filed: Apr. 7, 2004

(65) Prior Publication Data

US 2004/0188754 A1 Sep. 30, 2004

Related U.S. Application Data

(62) Division of application No. 10/210,446, filed on Aug. 1, 2002, now Pat. No. 6,744,097.

(30) Foreign Application Priority Data

Aug. 2, 2001 (KR) .............................. 01-46775

(51) Int. Cl.[7] .............................. H01L 21/336
(52) U.S. Cl. ...................... 438/259; 257/316; 257/318; 257/321; 365/185.28; 365/149; 438/258; 438/281
(58) Field of Search ................................ 257/316, 318, 257/321; 365/185.28, 149; 438/258, 259, 281

(56) References Cited

U.S. PATENT DOCUMENTS

| 4,796,228 A | * | 1/1989 | Baglee | 365/185.28 |
|---|---|---|---|---|
| 5,049,515 A |  | 9/1991 | Tzeng | 437/43 |
| 5,315,142 A |  | 5/1994 | Acovic et al. | 257/316 |
| 5,429,970 A | * | 7/1995 | Hong | 438/259 |
| 5,486,714 A | * | 1/1996 | Hong | 257/321 |
| 5,932,910 A |  | 8/1999 | Hong | 257/321 |
| 6,232,632 B1 |  | 5/2001 | Liu | 257/315 |

* cited by examiner

Primary Examiner—David Nelms
Assistant Examiner—Dao H. Nguyen
(74) Attorney, Agent, or Firm—Mills & Onello LLP

(57) ABSTRACT

An EEPROM memory cell and a method of forming the same are provided. A portion of a floating gate is formed on walls of a trench formed on the substrate. An inside of the trench is filled with a gate electrode layer constituting a sensing line. This leads to increases in opposite areas of a floating gate and a control gate of a sensing transistor, and a decrease in an area of the floating gate in the substrate. The method of forming an EEPROM memory cell comprises forming a trench in an active area in which a sensing transistor of the substrate will be formed; forming a gate insulation layer including a tunneling insulation layer on an entire surface of the substrate including an inside of the trench; conformally forming a first conductive layer covering the inside of the trench after forming the gate insulation layer; conformally forming a dielectric layer on the first conductive layer; forming a floating gate by patterning the first conductive layer; and stacking and patterning a second conductive layer on the dielectric layer to form a word line and a sensing line.

4 Claims, 9 Drawing Sheets

EEPROM MEMORY CELL AND METHOD OF FORMING THE SAME

RELATED APPLICATION

This application is a divisional of U.S. application Ser. No. 10/210,446, filed on Aug. 1, 2002 now U.S. Pat. No. 6,744,097, which relies for priority upon Korean Patent Application No. 01-46775, filed on Aug. 2, 2001, the contents of which are herein incorporated by reference in their entirety.

FIELD OF THE INVENTION

The present invention relates to an EEPROM memory cell structure and a method of forming the same. More specifically, the invention is directed to an EEPROM memory cell structure and a method of forming the same, which can not only maintain operation characteristics, but also reduce area of an EEPROM cell.

BACK OF THE INVENTION

An EEPROM memory is a nonvolatile memory that is semi-permanently capable of retaining data in a memory cell even while power is not applied. In particular, the EEPROM memory is an electrically programmable and erasable memory device.

Figure 1:
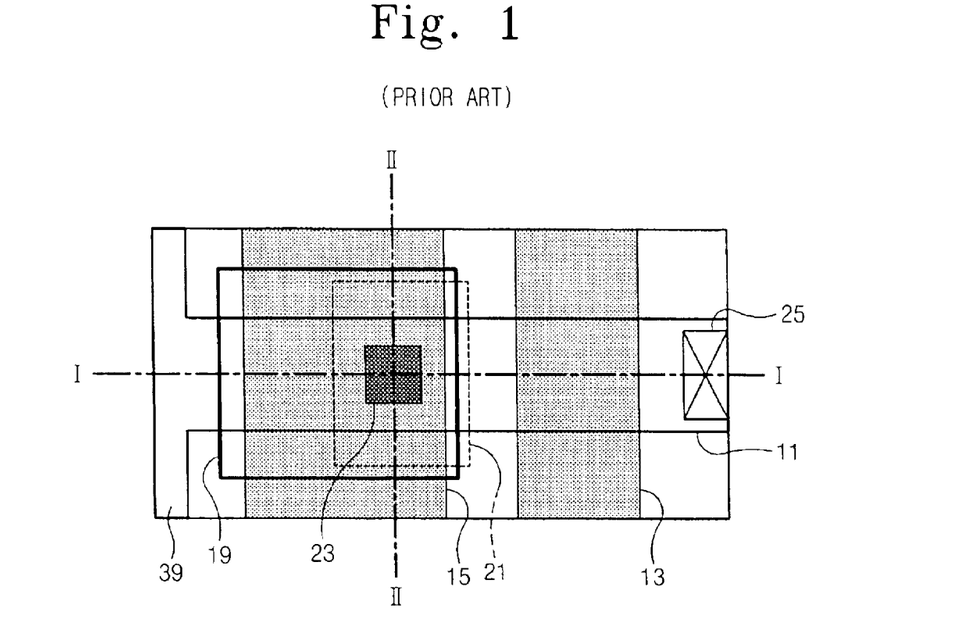
FIG. 1 is a top plan view showing a typical EEPROM memory cell.
Figure 2:
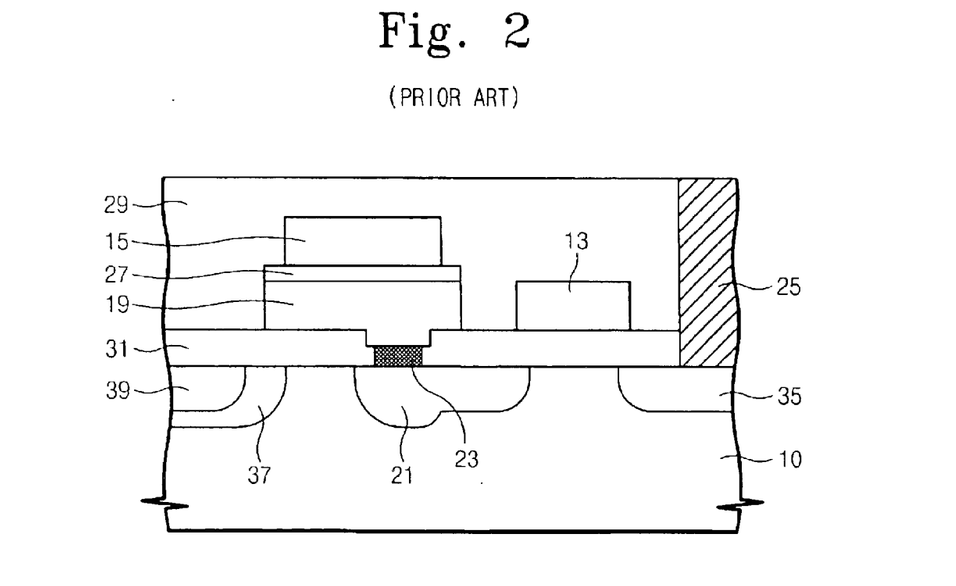
FIGS. 2 and 3 are cross-sectional views taken along lines I—I and II—II, respectively, of FIG. 1.
Figure 3:
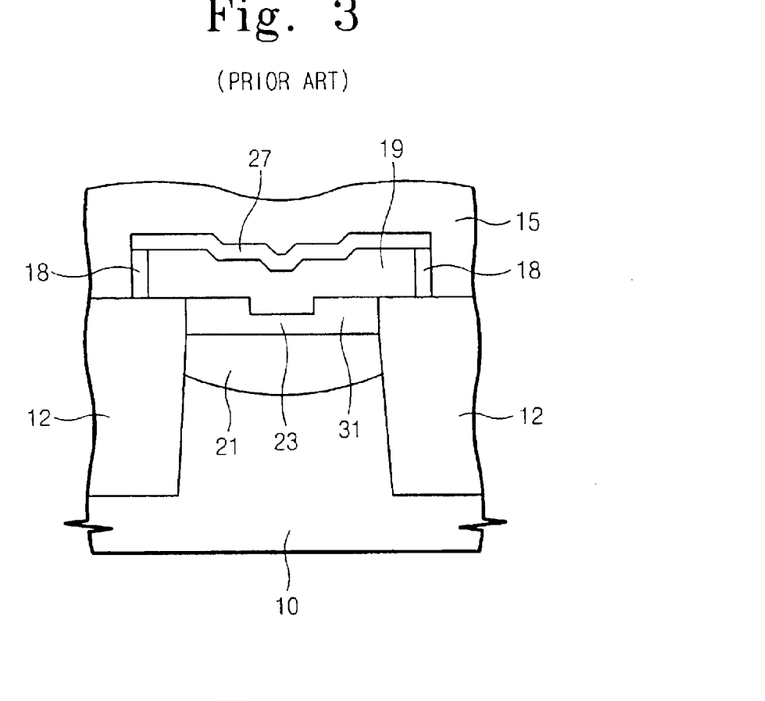

FIG. 1 is a top plan view showing a typical EEPROM memory cell, and FIGS. 2 and 3 are cross-sectional views taken along lines I—I and II—II of FIG. 1, respectively.

Referring to FIGS. 1 to 3, the EEPROM memory cell consists of two transistors that are connected in series along an active region 11 formed long in one direction. One of the transistors is a sensing transistor having a floating gate 19, and the other is a selection transistor having a single gate. A bit line contact 25 is connected to a drain region 35 of the selection transistor. A source region 21 of the selection transistor corresponds to a drain region of the sensing transistor. The drain region 21 of the sensing transistor is widened to the substrate under the floating gate 19 constituting the sensing transistor. The sensing transistor includes a tunnel insulation layer 23 surrounded by gate insulation layer 31. The tunnel insulation layer 23 is interposed between the floating gate 19 and the drain region 21. A source region 37 of the sensing transistor is widened to be connected to a common source line 39. In the EEPROM memory cell array, the memory cells are arranged in a matrix of rows and columns. Gate electrodes of the selection transistors in a row are connected with each other to form a word line 13 across the active regions, whereas gate electrodes of the sensing transistors in a row are connected with each other to form a sensing line 15 across the active regions.

In particular, referring to FIGS. 2 and 3, the selection transistor includes the gate insulation layer 31, the gate electrode, the drain region 35, and the source region. The gate insulation layer 31 is interposed between the word line 13 and the active region. The word line 13 corresponds to the gate electrode of the selection transistor. The drain region 35 is formed by doping first-type impurity ions into one end of the active region. The bit line contact 25 is connected to the drain region 35. The source region serves as the drain region of the sensing transistor.

The sensing transistor includes the gate insulation layer 31 and the tunnel insulation layer 23 formed on a substrate. The tunnel insulation layer 23 is surrounded by a region where the gate insulation layer 31 is formed. The floating gate 19, a dielectric layer pattern 27 and a control gate (a gate electrode of the sensing transistor; 15) are sequentially formed on the gate insulation layer 31 and the tunnel insulation layer 23. The common source line 39 is typically formed by doping first-type impurity ions at a high concentration. The common source line 39 is connected to the sensing transistor through the source region 37. A substrate 10 is doped by second-type impurity ions at a low concentration. Generally, the bit line contact 25 is formed in a contact region and penetrates an interlayer insulation layer 29 to connect a bit line to the active region.

The floating gate 19 is formed wider than the active region enough to stretch over a device isolation layer. Also, the floating gate 19 is isolated from the substrate 10 by the gate insulation layer 31. Likewise, the floating gate 19 is isolated from the control gate 15 by the dielectric layer pattern 27 and sidewall oxide layers 18. Data may be stored in a memory cell by injecting and emitting electric charges in the floating gate 19 through the tunneling insulation layer 23.

For example, while the common source line is grounded or floated and the bit line is grounded, high voltages of 15 to 20V are applied to a word line and the sensing line. Under such conditions, electrons in the substrate are injected into the floating gate through the tunneling insulation layer. That is, the memory cell is under a state of erasion. In this case, a threshold voltage of the sensing transistor is increased up to 3 to 7 V.

By contrast, while the common source line is at a low positive voltage or floated; high voltages are applied to the bit line and the gate line, and a zero voltage is applied to the sensing line. Under such condition, the electrons in the floating gate are emitted through the tunneling insulation layer. Thus, a threshold voltage of the sensing transistor is decreased to −4 to 0V.

To improve erase and program operations of the memory cell, a coupling ratio (CR) must be high. The coupling ratio (CR) is defined as the following equation 1. 'Cono' is a capacitance of a capacitor comprising a control gate, a dielectric layer and a floating gate. 'Ctun' is a capacitance of another capacitor comprising a floating gate, a tunnel insulation layer and a substrate.

$$CR = \frac{Cono}{Cono + Ctun} \qquad \text{[Equation 1]}$$

Assuming that the 'Ctun' is a predetermined value, the coupling ratio (CR) is increased with the value 'Cono'. Assuming that a dielectric ratio of the dielectric layer is a predetermined value, the capacitance is proportional to areas of opposite electrodes and inversely proportional to a thickness of the dielectric layer. Accordingly, where other conditions are the same, the area of the floating gate should be increased and the thickness of the dieletric layer should be decreased in order to improve the erase and program operations of the memory cell. However, as integration level of memory devices gradually increases, horizontal dimensions of the EEPROM memory cell should be reduced. Accordingly, it is difficult to widely form the floating gate on the substrate. Also, the dielectric layer must have a thickness sufficient to maintain an insulating reliability. Therefore, a thickness of the dielectric layer cannot be continuously decreased.

Meanwhile, due to a breakdown voltage limit, an electric field of the insulation layer cannot be continuously increased with an increase in a voltage applied to the control gate. In addition, the memory device must further comprise a voltage pumping circuit region so as to raise a voltage. And, various portions of a semiconductor device should be formed to endure a high voltage.

SUMMARY OF THE INVENTION

It is therefore a feature of the present invention to provide an EEPROM memory cell and a method of forming the same, which can erase and program data with reliability, and also can reduce each area of a cell region and a floating gate to achieve a high integration of a semiconductor device.

It is another feature of the present invention to provide an EEPROM memory cell and a method of forming the same, which can reduce a minimum value of an operating voltage in order to erase and program data with reliability.

The present invention is directed to an EEPROM memory cell that includes a floating gate that is conformally formed in a trench formed at a substrate.

The memory cell comprises a device isolation layer disposed on a predetermined region of the substrate to define an active region in one direction. Source and drain regions are separately formed in a predetermined region of the active region. The trench is formed at the active region between the source and drain regions. A word line crosses the active region between the trench and the drain region. The floating gate is conformally formed on a bottom and sidewalls of the trench. A sensing line crosses the floating gate and is disposed in parallel with the word line. A dielectric layer pattern is interposed between the sensing line and the floating gate, and a tunneling insulation layer pattern is interposed between the floating gate and the active region. A gate insulation layer is interposed between the word line and the active region, and disposed also in the vicinity of the tunneling insulation layer pattern between the word line and the active region. A cell junction region is formed in the active region between the word line and the sensing line.

In accordance with another aspect, the invention is directed to a method of fabricating an EEPROM memory cell that includes a floating gate that is conformally formed in a trench formed at a substrate. The method comprises forming a trench at a predetermined region of the substrate, forming a tunneling insulation layer pattern and a gate insulation layer on an entire surface of the substrate where the trench is formed. The tunneling insulation layer pattern is formed on a trench bottom or on a predetermined region adjacent to the trench. The gate insulation layer is formed on an entire surface of the substrate surrounding the tunneling insulation layer pattern. A first conductive layer is conformally formed on an entire surface of the substrate where the tunneling insulation layer pattern and the gate insulation layer are formed. Thereafter, a dielectric layer is conformally formed on the resultant structure where the first conductive layer is formed. The dielectric layer and the first conductive layer are successively patterned to form a floating gate and a dielectric layer pattern. The floating gate covers a bottom and sidewalls of the trench and the dielectric layer pattern is formed on the floating gate. A second conductive layer is then formed on an entire surface of the resultant structure where the floating gate and the dielectric layer pattern are formed. The second conductive layer is patterned to form a sensing line and a word line. The sensing line crosses the floating gate, while the word line is separated from the sensing line by a predetermined interval and formed in parallel with the sensing line.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE PREFERRED EMBODIMENT

Figure 4:
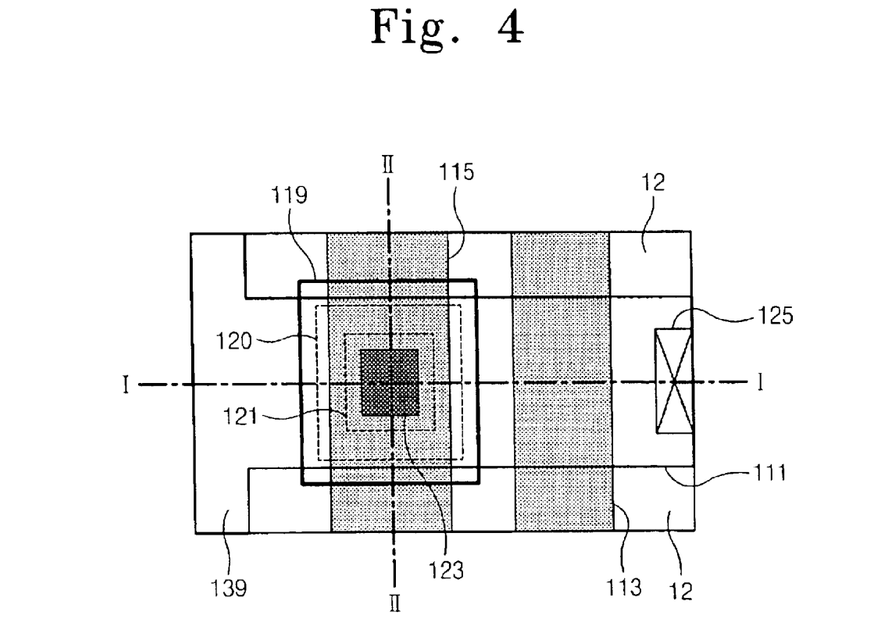
FIG. 4 is a top plan view showing an EEPROM memory cell in accordance with a first embodiment of the present invention.
Figure 5:
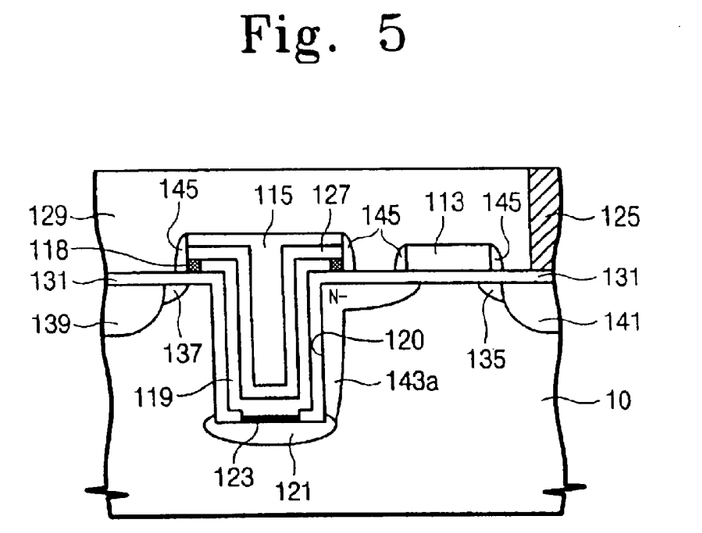
FIGS. 5 and 6 are cross-sectional views taken along lines I—I and II—II, respectively, of FIG. 4.
Figure 6:
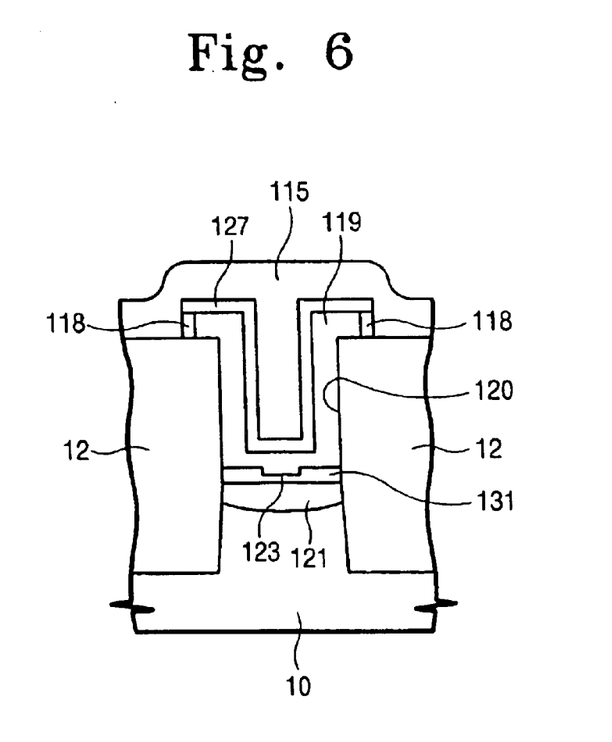

FIG. 4 is a top plan view showing an EEPROM memory cell in accordance to a first embodiment of the present invention. FIGS. 5 and 6 are cross-sectional views taken along lines I—I and II—II of FIG. 4, respectively.

Referring to FIG. 4, a device isolation layer is formed to define an active region 111 in one direction. A common source line 139 is formed perpendicularly to the active region 111. A bit line contact 125 is formed at the active region 111. A sensing line 115 and a word line 113 are formed across the active region between the common source line 139 and the bit line contact 125. A trench 120 is formed at the active region 111 under the sensing line 115. Generally, an upper part of the trench 120 is formed wider than a bottom of the trench 20. A floating gate 119 is formed over the trench 120. The floating gate 119 is wider than the upper part of the trench 120 by a certain width to all directions. A tunneling insulation layer 123 is formed in the trench 120. The tunneling insulation layer 123 is an insulation layer thinly formed to induce carrier tunneling. An impurity doped region 121 is formed at the trench bottom under the tunneling insulation layer 123.

Referring to FIG. 5, a surface of the active region (111 of FIG. 4) excluding the bit line contact region 125 is covered with a gate insulation layer 131 that is a silicon oxide layer. The tunneling insulation layer 123 is formed in a portion of the trench bottom. The tunneling insulation layer 123 is formed thinner than the gate insulation layer 131. The floating gate 119 is conformally formed on the trench 120. The width of the floating gate 119 is wider than that of the trench 120 by a certain width. A dielectric layer pattern 127 is conformally formed on the floating gate 119. Each sidewall of the floating gate 119 is covered with a sidewall oxide layer 118. The sensing line 115 is formed to fill a gap region of the floating gate 119 and to cover a predetermined portion of the floating gate. The dielectric layer pattern 127 is interposed between the sensing line 115 and the floating gate 120. The word line 113 is formed across the active region between the sensing line 115 and the bit line contact 125. Lightly doped N-type regions 135 and 143a are formed in the active region located at both sides of the word line 113. A heavily doped N-type region 141 is formed in the active region under the bit line contact 125. The heavily doped N-type region 141 is connected to the lightly doped N-type region 135. The lightly doped N-type region 143a between the sensing line 115 and the word line 113 is widened to a sidewall of the trench 120. An N-type doped region 121 is formed at the bottom of the trench 120 in the substrate. The lightly doped N-type region 143a is connected to an N-type doped region 121. The lightly doped N-type region 143a and the N-type doped region 121 correspond to a cell junction region. The sidewall of the trench 120 facing the common source line 139 forms a channel of the sensing transistor. A source region 137 is formed between the common source line 139 and the floating gate 119. The source region 137 is a lightly doped region and the common source line 139 is a heavily doped region. A spacer 145 is formed on sidewalls of the sensing line and the word line. Both gate lines are covered with an interlayer insulation layer 129.

Referring to FIG. 6, a sensing transistor is formed between device isolation layers 12. The device isolation layer 12 is formed at both sides of the active region. A gate insulation layer 131, a floating gate 119, a dielectric layer pattern 127 and a sensing line 115 are formed on the active region. The gate insulation layer 131 is formed in the trench 120 to be in contact with the substrate of the trench bottom. The floating gate 119 and the dielectric layer pattern 127 are extended from both sidewalls of the trench to its peripheral region by a certain width. The sensing line 115 is formed to fill a gap region surrounded by the dielectric layer pattern 127 and to cover the dielectric layer pattern 127. The sidewall of the floating gate 119 is covered with a sidewall oxide layer 118 or a dielectric layer. The sidewall oxide layer 118 or the dielectric layer is formed during an annealing process. As a result, the floating gate 119 remains isolated from the sensing line 115. An N-type doped region 121 is formed in the substrate constituting the trench bottom.

FIGS. 7 through 17 are cross-sectional views for illustrating a method of forming an EEPROM memory cell shown in FIG. 4.

Figure 7:
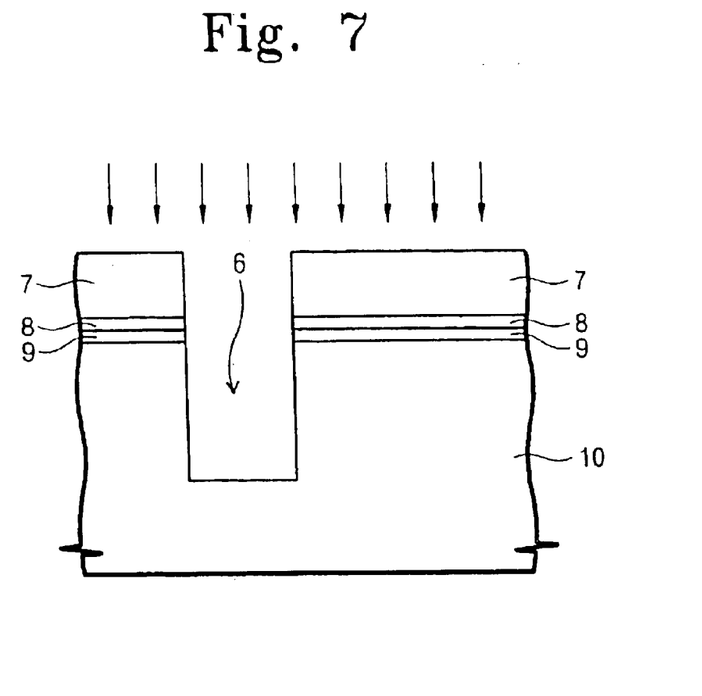
FIGS. 7 through 17 are cross-sectional views illustrating a method of forming an EEPROM memory cell in accordance with the embodiment of FIG. 4.

Referring to FIG. 7, an etch-stop layer 8 and a pad oxide layer 9 are formed on a substrate 10 having a device isolation layer. The etch-stop layer 8 is composed of silicon nitride. A first photoresist pattern 7 as an etch mask is formed on the substrate 10. Thereafter, the etch-stop layer 8, the pad oxide layer 9 and the silicon substrate 10 are successively etched to form a trench 6 at the sensing transistor region of the active region. The substrate is a P-type substrate on which P-type impurity ions are lightly doped. The first photoresist pattern 7 is removed after etching the etch-stop layer or the pad oxide layer, or after forming the trench 6.

Figure 8:
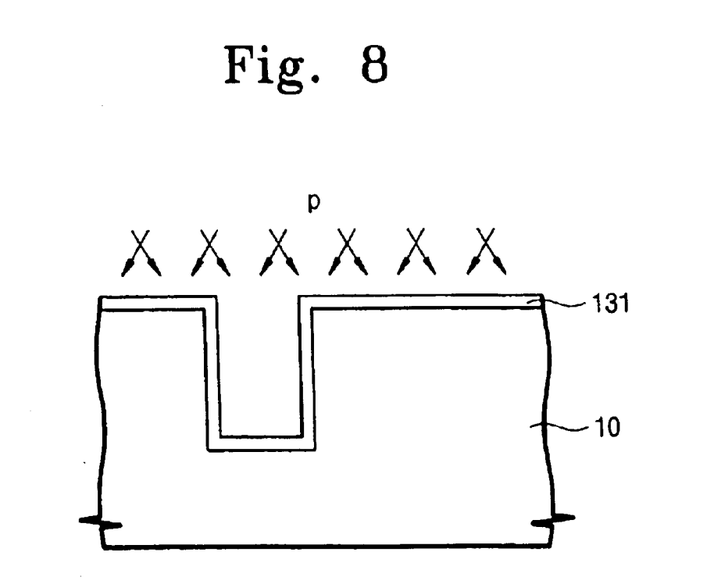

Referring to FIG. 8, the remaining etch-stop layer 8 and pad oxide layer 9 are removed from the substrate 10 having the trench 6. The substrate surface is thermally oxidized to form a gate insulation layer 131. P-type impurity ions may be implanted before or after the thermal oxidation in order to prevent a punch through phenomenon and adjust an operating voltage.

Figure 9:
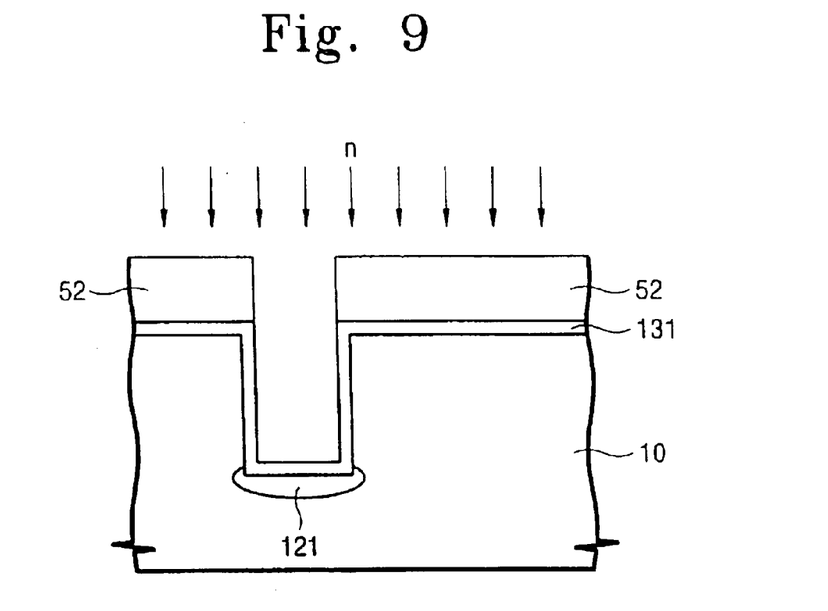

Referring to FIG. 9, a second photoresist pattern 52 is formed to expose the trench bottom. N-type impurity ions are then implanted into the substrate 10. As a result, an N-type doped layer is formed. In this case, impurity ions should be implanted at a high energy sufficient to penetrate the gate insulation layer 131. In one embodiment, impurity ions are implanted at a dose of $10^{13}$ ions/cm$^2$ and higher, preferably, about $2 \times 10^{13}$ to $5 \times 10^{13}$ ions/cm$^2$. The second photoresist pattern 52 is then removed.

Figure 10:
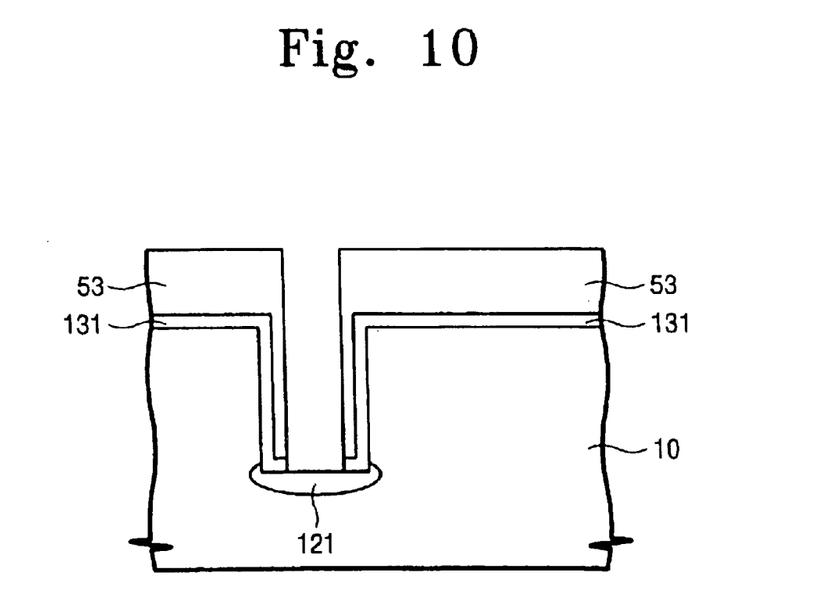

Referring to FIG. 10, a third photoresist pattern 53 is formed to expose a portion of the trench bottom. The exposed gate insulation layer 131 is then etched. After removing the third photoresist pattern 53, the exposed substrate is thermally oxidized to form a thin insulation layer that is suitable for a tunneling. In this case, the tunneling insulation layer may be an oxide nitride layer instead of an oxide layer. The second photoresist pattern 52 for an ion implantation mask (shown in FIG. 9) may be used as the third photoresist pattern during the process of FIG. 10. However, during the process of FIG. 9, a line-type photoresist pattern may be formed to stretch over the active region and the device isolation layer. Also, during the process of FIG. 9, the photoresist pattern may be formed wider than the region including the tunneling insulation layer. For this reason, the second and third photoresist patterns are typically formed separately.

Figure 11:
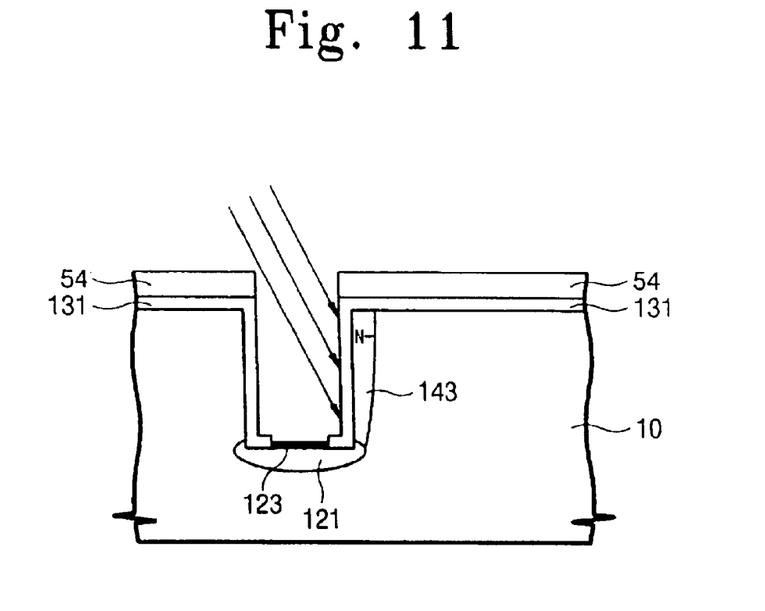

Referring to FIG. 11, a fourth photoresist pattern 54 is formed to expose a sidewall of the trench and to cover the upper side of the substrate. An N-type region 143 is formed in the substrate of the trench sidewall adjacent to a bit line contact by an oblique ion implantation. The oblique ion implantation enables impurity ions to be implanted into lower corners of the trench. Preferably, the photoresist pattern has a thickness of less than 1 mm. The N-type region 143 is formed at a higher energy and at a lower or similar dose as compared with an implantation into a lightly doped region of a typical LLD-type transistor. At this time, impurity ions are implanted with 60 to 90 KeV and a dose of $10^{13}$ ion/cm$^2$. Accordingly, the N-type region 143 of the trench sidewall is formed at a lower dose as compared with a lightly doped region of a typical transistor.

The fourth photoresist pattern 54 may be formed by using it as it is or processing the third photoresist pattern 53 of FIG. 10. For example, the third photoresist pattern 53 of FIG. 10 can be isotropically ashed and a surface thereof recessed to form the fourth photoresist pattern 54 of FIG. 11. In this case, after implanting impurity ions as shown in FIG. 11, the fourth photoresist pattern 54 is removed. Thereafter, the substrate is thermally oxidized to form a tunneling insulation layer 123.

Figure 12:
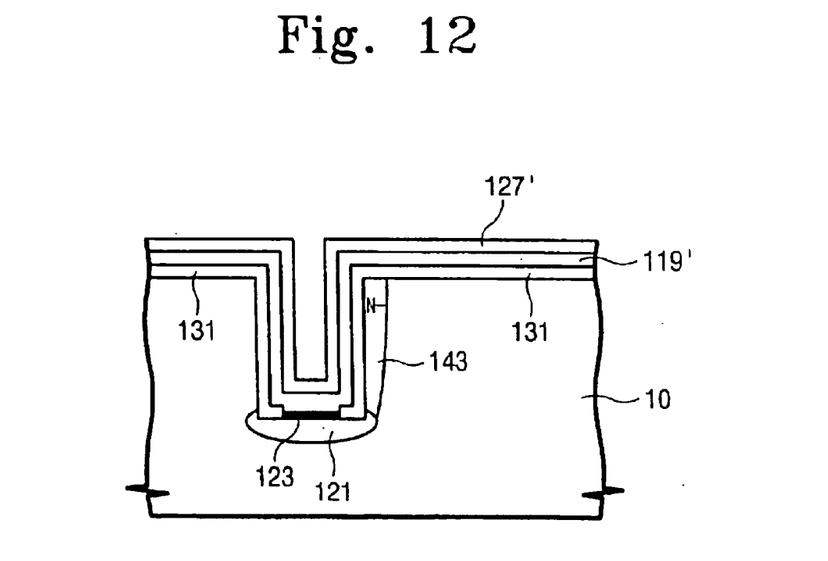

Referring to FIG. 12, the fourth photoresist pattern is removed from the substrate. Thereafter, a first polysilicon layer 119' and a dielectric layer 127' are sequentially stacked on the substrate where a gate insulation layer 131 including a tunneling insulation layer 123 is formed. The dielectric layer is generally an oxide-nitride-oxide (ONO) layer or a combination of a silicon nitride layer and a silicon oxide layer. When the polysilicon layer 119' and the dielectric layer 127' are stacked on the substrate, a thickness of the stacked layers should be adjusted to remain a predetermined space in an inside of the trench.

Figure 13:
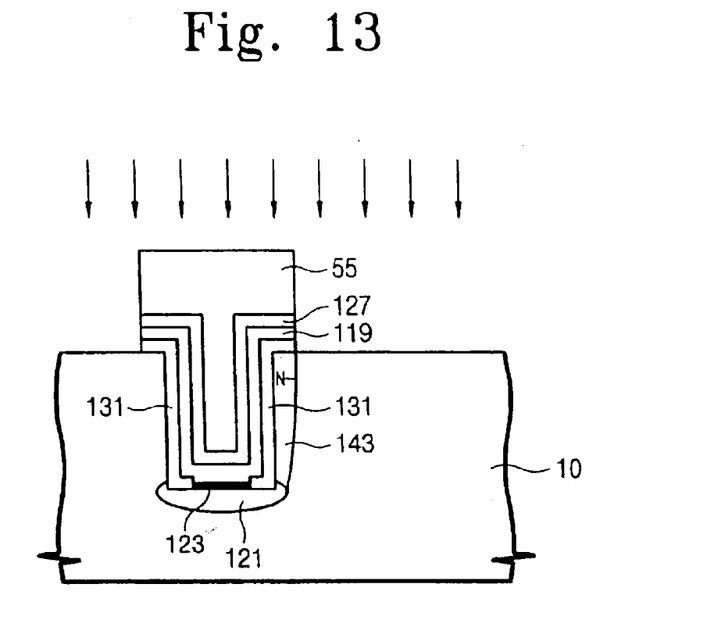

Referring to FIG. 13, a fifth photoresist pattern 55 is formed to cover at least a trench region. The dielectric layer and the first polysilicon layer are etched by using the fifth photoresist pattern 55 as an etch mask. As a result, the floating gate 119 is formed and covered with a dielectric layer pattern 127.

Figure 14:
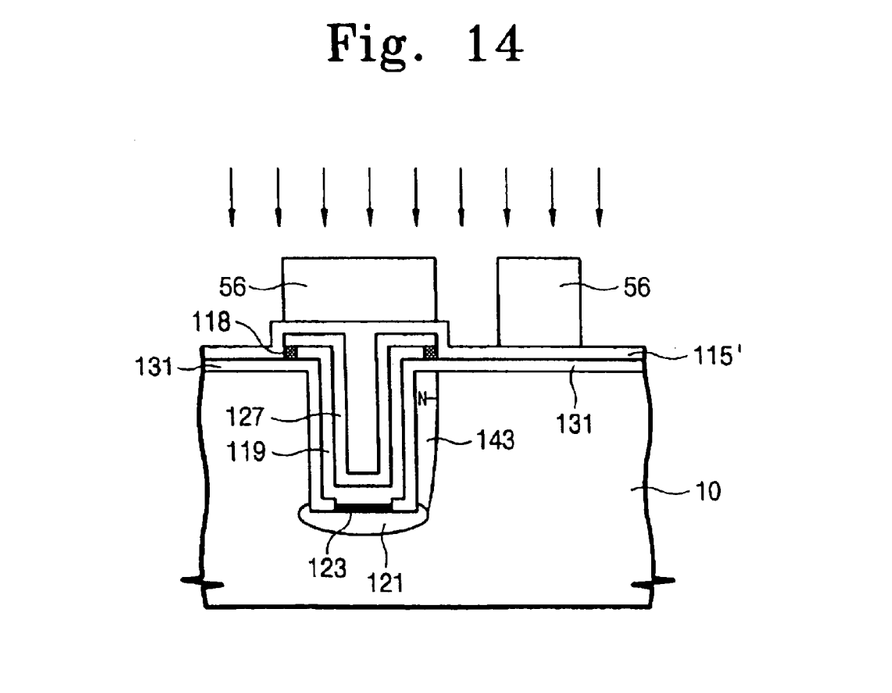

Referring to FIG. 14, the fifth photoresist pattern is removed by ashing and wet stripping. A sidewall of the floating gate 119 is annealed to cure etching damage. Also, the exposed sidewall of the floating gate is thermally oxidized to form a sidewall oxide layer 118. A second polysilicon layer 115' is stacked on an entire surface of the substrate. A sixth photoresist pattern 56 corresponding to a sensing line and a word line is formed on the second polysilicon layer 115'.

Figure 15:
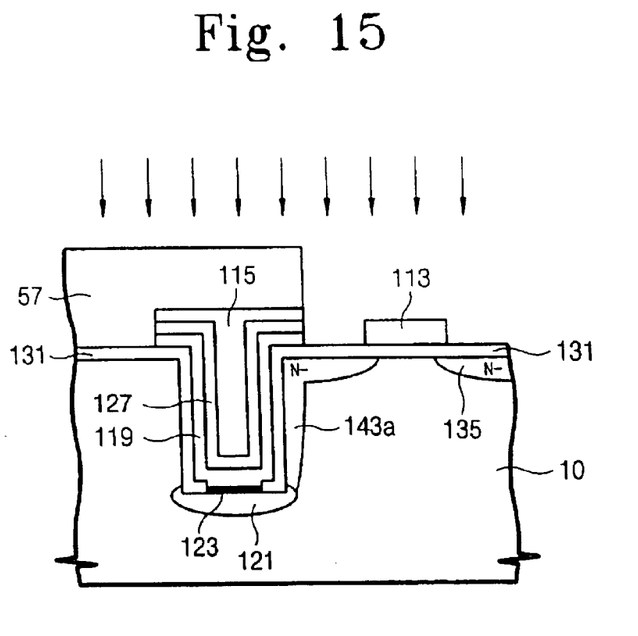

Referring to FIG. 15, the second polysilicon layer is etched to form a sensing line 115 and a word line 113. The sensing line 115 may be formed wider or narrower than a floating gate 119, though the sensing line 115 must be wide enough to fill the remaining space of the trench. At this time, although not shown in the drawings, a patterning process is preferably performed together to form a gate electrode of an NMOS transistor in a peripheral circuit region.

After removing the sixth photoresist pattern 56, a seventh photoresist pattern 57 is formed. The seventh photoresist pattern exposes high-voltage regions adjacent to the word line 113 in a cell memory active region. Although a peripheral region of the memory device is not shown, the seventh photoresist pattern 57 is typically formed in consideration of formation of a high-voltage NMOS transistor in a peripheral region. N-type impurity ions are implanted into the substrate by using the seventh photoresist pattern 57 as an ion implantation mask to form lightly doped N-type regions 135 and 143a. N-type impurity ions are implanted into the active region at a low dose of about $10^{13}$ ions/cm$^2$ and at a high energy of about 60 KeV so as to obtain a required breakdown voltage.

Considering the whole memory device, P-type impurity ions may be implanted to form a high-voltage PMOS transistor in a peripheral circuit region. In this case, P-type impurity ions are implanted using a separate photoresist pattern like the foregoing N-type impurity ion implantation. Generally, after forming the lightly doped N-type regions 135 and 143a, the seventh photoresist pattern 57 is removed. Thermal diffusion is then performed to achieve a predetermined junction depth and a predetermined concentration. At this time, sidewalls of the gate line may be cured by the thermal diffusion.

Figure 16:
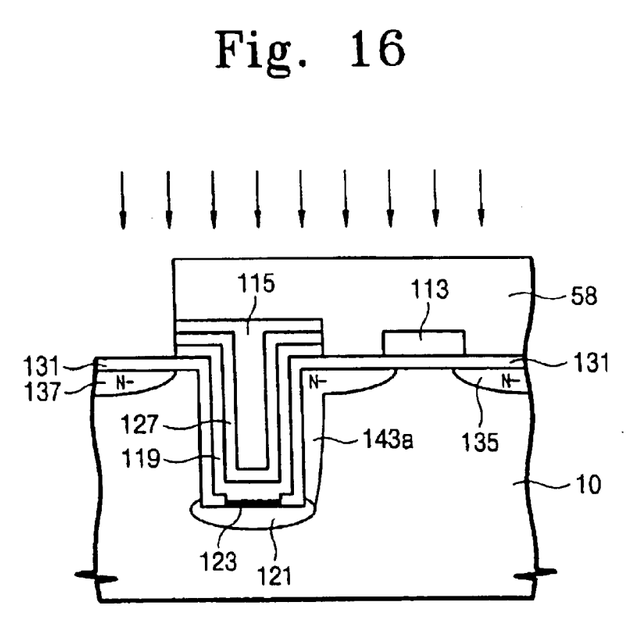

Referring to FIG. 16, after the seventh photoresist pattern is removed, an eighth photoresist pattern 58 is formed to expose a source region of the sensing transistor. N-type impurity ions are then implanted at a dose of about $3\times10^{13}$ ions/cm$^2$ and at a low energy of about 20 KeV to form a lightly doped region corresponding to a source region 137. Considering the whole memory device, low-concentration impurity ions may be implanted into a peripheral circuit region to form an NMOS transistor. Also, P-type impurity ions may be implanted using a separate photoresist pattern like the foregoing N-type impurity ion implantation. The eighth photoresist pattern 58 is then removed.

Figure 17:
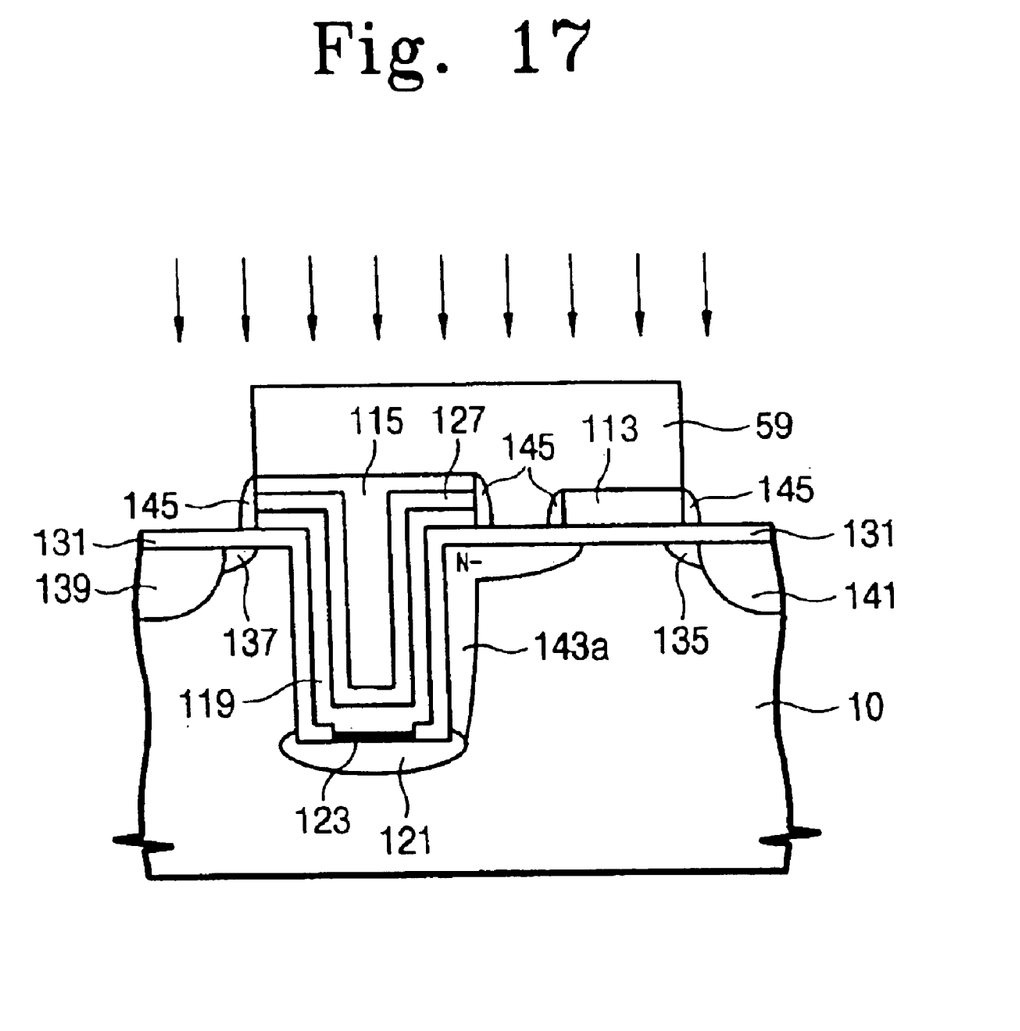

Referring to FIG. 17, an insulation layer such as a silicon nitride layer is stacked on the lightly doped substrate. Continuously, the insulation layer is etched using an anisotropic etch process to form a spacer 145 on each sidewall of the floating gate 119, the sensing line 115, the word line 113 and peripheral gate pattern (not shown). A ninth photoresist pattern 59 is then formed on the substrate. The ninth photoresist pattern 59 covers the sensing line 115, the word line 113, and the substrate therebetween. High-concentration impurity ions are implanted into the active region using the ninth photoresist pattern 59 as an ion implantation mask. This results in formation of a heavily doped region such as a common source line 139 and a contact region 141. The high-concentration impurity ions are implanted with a dose of about $10^{15}$ ions/cm$^2$ and about 60 to 90 KeV. Impurity ions may be implanted into a heavily doped region of the NMOS transistor source/drain along with the foregoing ion implantation. P-type impurity ions may be implanted into a PMOS transistor using a separate photoresist pattern like the foregoing N-type impurity ion implantation.

In the subsequent processes, an interlayer insulation layer is stacked; a contact hole is formed on a contact region; and a bit line contact and a bit line are formed. In some cases, impurity ions may be implanted into the contact region during a high-concentration impurity ion implantation. That is, impurity ions may be implanted into the contact region after forming a contact hole in the interlayer insulation layer.

According to the present invention, a floating gate is formed at a trench to increase an opposite area to a control gate. As a result, a coupling ratio of a sensing transistor in a cell memory may be increased. Furthermore, data can be erased and programmed in the memory cell with reliability at a comparatively low voltage.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method of forming an EEPROM memory cell, comprising:

forming a trench in a predetermined region of a substrate;

forming a gate insulation layer on an entire surface of the substrate where the trench is formed;

implanting impurity ions into the trench bottom;

removing the gate insulation layer of at least one of the trench bottom and the predetermined region adjacent to the trench to expose the substrate;

forming a tunneling insulation layer on the exposed substrate;

implanting impurity ions into one sidewall of the trench using an oblique ion implantation process;

sequentially conformally forming a first conductive layer and a dielectric layer on an entire surface of the substrate;

successively patterning the dielectric layer and the first conductive layer to form a floating gate and a dielectric layer pattern, wherein the floating gate covers the bottom and sidewalls of the trench and the dielectric layer pattern is formed on the floating gate;

forming a sidewall oxide layer on sidewalls of the floating gate; forming a second conductive layer on an entire surface of the substrate having the floating gate;

patterning the second conductive layer to form a sensing line and a word line that are parallel with each other, wherein the sensing line crosses the floating gate, and the word line is disposed in the vicinity of the trench sidewalls into which the impurity ions are implanted, perpendicularly to a normal line of the trench sidewalls; and implanting impurity ions into the substrate of both sides of the sensing line and the word line.

2. The method as claimed in claim 1, wherein implanting the impurity ions into the substrate of both sides of the sensing line and the word line comprises:

implanting impurity ions into the substrate of both sides of the word line to form a lightly doped regions;

implanting impurity ions into the substrate adjacent to the sensing line on opposite side of the lightly doped region to form a source region;

forming a spacer on each sidewall of the sensing line, the word line, and the floating gate; and implanting impurity ions into the substrate, using the sensing line, the word line, and the floating gate as an ion implantation mask, to form a common source line in alignment with a sidewall of the spacer adjacent to the source line, and to form a heavily doped region in the lightly doped region adjacent to the word line on opposite side of the sensing line.

3. The method as claimed in claim 1, wherein the oblique ion implantation process is performed at about 60 to 90 KeV and at a dose of $10^{13}$ ions/cm$^2$.

4. The method as claimed in claim 1, wherein impurity ions are implanted into the trench bottom at a dose of $10^{13}$ ions/cm$^2$.

* * * * *